(12) United States Patent
Hsu et al.

(10) Patent No.: US 12,476,211 B2
(45) Date of Patent: Nov. 18, 2025

(54) SEMICONDUCTOR DEVICE

(71) Applicant: Taiwan Semiconductor Manufacturing Company, Ltd., Hsinchu (TW)

(72) Inventors: Chien-Hao Hsu, Hsinchu County (TW); Yen-Kun Lai, New Taipei (TW); Wei-Hsiang Tu, Hsinchu (TW); Hao-Chun Liu, Hsinchu (TW); Kuo-Chin Chang, Chiayi (TW); Mirng-Ji Lii, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/672,010

(22) Filed: May 23, 2024

(65) Prior Publication Data

US 2024/0332230 A1 Oct. 3, 2024

Related U.S. Application Data

(63) Continuation of application No. 17/460,344, filed on Aug. 30, 2021, now Pat. No. 12,021,048.

(51) Int. Cl.
*H01L 23/00* (2006.01)
(52) U.S. Cl.
CPC ............. *H01L 24/06* (2013.01); *H01L 24/05* (2013.01); *H01L 24/13* (2013.01); *H01L 24/14* (2013.01); *H01L 2224/0401* (2013.01)

(58) Field of Classification Search
CPC ...................................... H01L 24/06
See application file for complete search history.

(56) References Cited

U.S. PATENT DOCUMENTS

| | | | | |
|---|---|---|---|---|
| 3,871,015 A * | 3/1975 | Lin | ................. | H01L 24/17 29/840 |
| 4,536,786 A * | 8/1985 | Hayakawa | .............. | H01L 24/79 257/737 |
| 5,539,153 A * | 7/1996 | Schwiebert | ............ | H01L 24/14 228/180.1 |
| 5,569,960 A * | 10/1996 | Kumazawa | .......... | H05K 3/3436 257/738 |
| 5,672,542 A * | 9/1997 | Schwiebert | ............ | H01L 24/14 438/615 |
| 5,796,169 A * | 8/1998 | Dockerty | .......... | H01L 23/49838 257/E21.511 |

(Continued)

*Primary Examiner* — William A Harriston
(74) *Attorney, Agent, or Firm* — JCIPRNET

(57) ABSTRACT

A semiconductor device including a semiconductor die, a first conductive pad, a second conductive pad, a first connector structure and a second connector structure is provided. The first conductive pad is disposed on the semiconductor die, wherein the first conductive pad has a first lateral dimension. The second conductive pad is disposed on the semiconductor die, wherein the second conductive pad has a second lateral dimension. The first connector structure is disposed on the first conductive pad, wherein the first connector structure has a third lateral dimension greater than the first lateral dimension. The second connector structure is disposed on the second conductive pad, wherein the second connector structure has a fourth lateral dimension smaller than the second lateral dimension.

20 Claims, 9 Drawing Sheets

(56) References Cited

U.S. PATENT DOCUMENTS

| | | | | |
|---|---|---|---|---|
| 5,892,179 A * | 4/1999 | Rinne | ...................... | H01L 24/11 |
| | | | | 361/767 |
| 5,977,632 A * | 11/1999 | Beddingfield | .......... | H01L 24/81 |
| | | | | 257/E21.511 |
| 6,201,305 B1 * | 3/2001 | Darveaux | .............. | H05K 1/111 |
| | | | | 257/781 |
| 6,222,277 B1 * | 4/2001 | Downes | ............... | H05K 3/3436 |
| | | | | 257/E21.511 |
| 6,586,844 B1 * | 7/2003 | Chang | ..................... | H01L 24/06 |
| | | | | 257/E23.021 |
| 6,940,176 B2 * | 9/2005 | Chen | ....................... | H01L 24/06 |
| | | | | 257/E23.07 |
| 6,960,828 B2 * | 11/2005 | Nair | ........................ | H01L 24/13 |
| | | | | 257/737 |
| 7,049,216 B2 * | 5/2006 | Rinne | ..................... | H01L 24/05 |
| | | | | 257/E23.021 |
| 7,084,500 B2 * | 8/2006 | Swnson | ................... | H01L 24/10 |
| | | | | 257/691 |
| 7,312,529 B2 * | 12/2007 | Clevenger | ............... | H01L 24/81 |
| | | | | 257/E21.069 |
| 7,531,898 B2 * | 5/2009 | Batchelor | ............... | H01L 24/05 |
| | | | | 257/737 |
| 7,564,130 B1 * | 7/2009 | Li | .......................... | H01L 24/13 |
| | | | | 257/772 |
| 7,566,650 B2 * | 7/2009 | Lin | ........................ | H01L 24/11 |
| | | | | 438/618 |
| 7,569,471 B2 * | 8/2009 | Pang | ....................... | H01L 24/14 |
| | | | | 257/738 |
| 9,343,360 B2 * | 5/2016 | Obu | ........................ | H01L 24/14 |
| 9,343,419 B2 * | 5/2016 | Yu | .......................... | H01L 24/17 |
| 10,163,843 B2 * | 12/2018 | Lee | ........................ | H01L 24/05 |
| 10,727,192 B2 * | 7/2020 | Abraham | .............. | H01L 23/488 |
| 11,101,238 B2 * | 8/2021 | Liu | ......................... | H01L 24/17 |
| 2003/0218243 A1 * | 11/2003 | Chen | .................... | H05K 3/3436 |
| | | | | 257/737 |
| 2005/0093151 A1 * | 5/2005 | Swanson | ................. | H01L 24/10 |
| | | | | 257/E23.021 |
| 2005/0104222 A1 * | 5/2005 | Jeong | ................... | H05K 3/3436 |
| | | | | 257/784 |
| 2006/0231949 A1 * | 10/2006 | Park | ....................... | H01L 23/50 |
| | | | | 257/E23.079 |
| 2007/0007665 A1 * | 1/2007 | Clevenger | ............... | H01L 23/13 |
| | | | | 257/E21.511 |
| 2007/0069346 A1 * | 3/2007 | Lin | ........................ | H01L 24/11 |
| | | | | 257/673 |
| 2009/0250813 A1 * | 10/2009 | Lin | ........................ | H01L 24/06 |
| | | | | 257/737 |
| 2011/0248398 A1 * | 10/2011 | Parvarandeh | ........... | H01L 24/11 |
| | | | | 257/737 |
| 2012/0012985 A1 * | 1/2012 | Shen | ....................... | H01L 24/16 |
| | | | | 438/455 |
| 2013/0228916 A1 * | 9/2013 | Mawatari | ................ | H01L 24/14 |
| | | | | 257/737 |
| 2016/0322323 A1 * | 11/2016 | Lai | ........................ | H01L 24/14 |
| 2018/0108633 A1 * | 4/2018 | Park | ....................... | H01L 24/14 |
| 2018/0211935 A1 * | 7/2018 | Liu | ........................ | H01L 24/81 |
| 2022/0336305 A1 * | 10/2022 | Komiya | ............ | H01L 23/53242 |

* cited by examiner

SEMICONDUCTOR DEVICE

CROSS-REFERENCE TO RELATED APPLICATION

This application is a continuation application of and claims the priority benefit of a prior application Ser. No. 17/460,344, filed on Aug. 30, 2021, now allowed. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. In other words, semiconductor devices require better performance, reliability, and yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
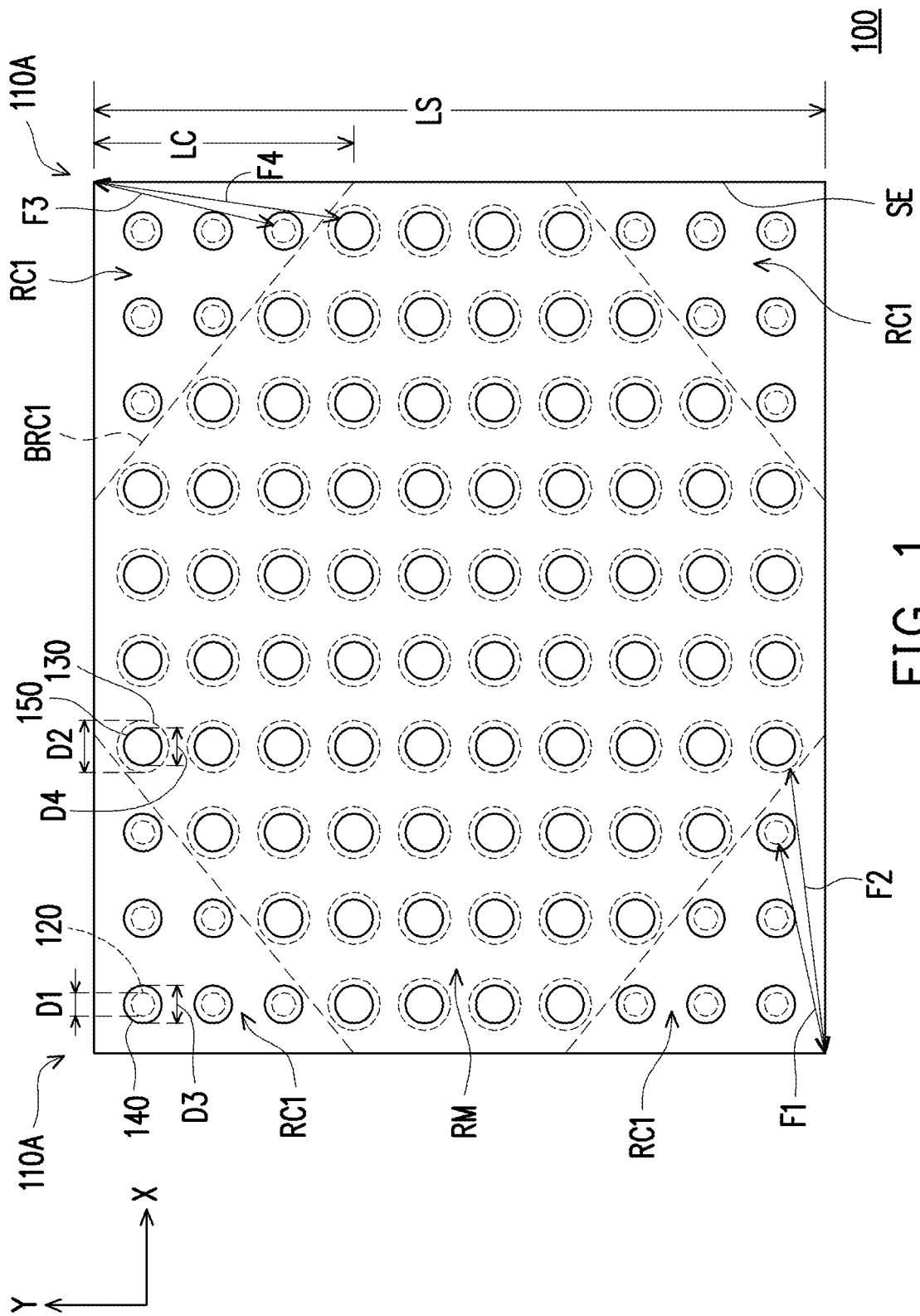
FIG. 1 schematically illustrates a plane view of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 schematically illustrates a plane view of a semiconductor device in accordance with some embodiments of the disclosure. A semiconductor device 100 includes a semiconductor die 110, first conductive pads 120, second conductive pads 130, first connector structures 140 and second connector structures 150. FIG. 1 presents the side of the semiconductor device 100 to be bonded to other device through semiconductor die bonding process and omits some components of the semiconductor device 100 such as wirings, dielectric layers, active components, passive components or the like. In addition, the first conductive pads 120 and the second conductive pads 130 may not be exposed at the surface of the semiconductor device 110, but are presented in FIG. 1 for showing the relationship of the pads and the connector structures. For example, the first conductive pads 120 and the second conductive pads 130 are covered by at least one passivation layer that is not shown in FIG. 1 and thus the first conductive pads 120 and the second conductive pads 130 are sketched using dash lines in FIG. 1.

The first conductive pads 120 and the second conductive pads 130 are arranged in an array along X direction and Y direction. The first connector structures 140 are arranged corresponding to the first conductive pads 120, respectively and the second connector structures 150 are arranged corresponding to the second conductive pads 130, respectively. In some embodiments, one first connector structure 140 overlaps one corresponding first conductive pad 120 and one second connector structure 150 overlaps one corresponding second conductive pad 130. In some embodiments, in a predetermined direction, the pitch of the first conductive pads 120 may be identical to the pitch of the first connector structures 140 and the pitch of the second conductive pads 130 may be identical to the pitch of the second connector structures 150. In some embodiments, the pitches of the first conductive pads 120 and the second conductive pads 130 may be the same or different. Alternatively, the pitches of the first connector structures 140 and the second connector structures may be the same or different. In some embodiments, the first conductive pads 120 and the second conductive pads 130 may respectively be arranged in a nonfixed pitch. In some embodiments, the geometric center of the shape defined by the outline of the first conductive pads 120 may be aligned with the geometric center of the shape defined by the outline of the first connector structure 140, and the geometric center of the shape defined by the outline of the second conductive pads 130 may be aligned with the geometric center of the shape defined by the outline of the second connector structure 150.

Figure 2:
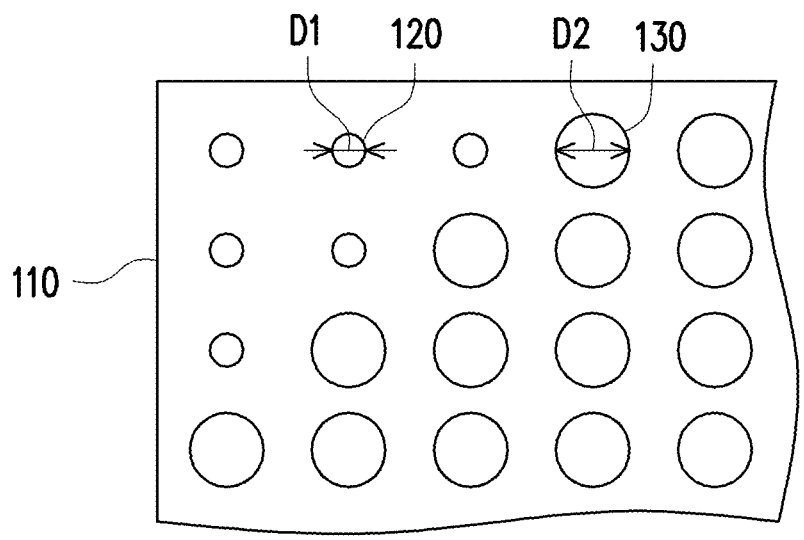
FIGS. 2 and 3 respectively illustrates the arrangements of conductive pads and the arrangements of the connector structures in a plane view of the semiconductor device.
Figure 3:
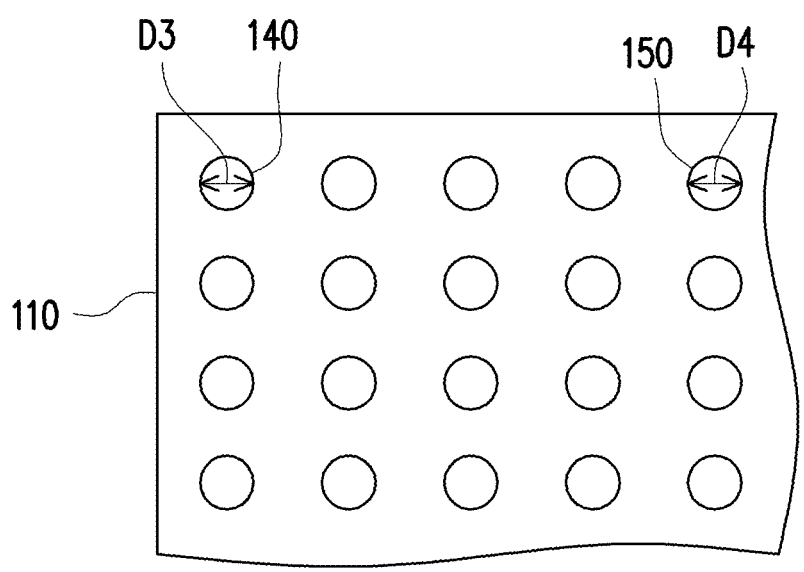

FIGS. 2 and 3 respectively illustrates the arrangements of conductive pads and the arrangements of the connector structures in a plane view of the semiconductor device. Referring to FIGS. 1 to 3, the first conductive pad 120 has a first lateral dimension D1, the second conductive pad 130 has a second lateral dimension D2, the first connector structure 140 has a third lateral dimension D3, and the second connector structure 150 has a fourth lateral dimension D4. The first lateral dimension D1, the second lateral dimension D2, the third lateral dimension D3 and the fourth dimension D4 are the dimensions of the respective components that are measured in the same direction. In some embodiments, the dimensions of one component measured in different directions may be different or the same. The first connector structure 140 may have an area greater than the corresponding conductive pad 120 and the third lateral dimension D3 is greater than the first lateral dimension D1. The second connector structure 150 may have an area smaller than the corresponding second conductive pad 130 and the fourth lateral dimension D4 is smaller than the second lateral dimension D2. In some embodiments, as shown in FIG. 3, the first connector structures 140 may have the same area as the second connector structures 150 and namely, the third lateral dimension D3 is identical to the fourth lateral dimension D4. In some embodiments, as shown in FIG. 2, the first conductive pad 120 may have an area smaller than the second conductive pad 130 and namely, the first lateral dimension D1 is smaller than the second lateral dimension D2. In some alternative embodiments, the first connector structures 140 may have a different area from the second connector structures 150 and the third lateral dimension D3 is different from the fourth lateral dimension D4. The first lateral dimension D1 may be identical to the second lateral dimension D2 while the first lateral dimension D1 is smaller than the third lateral dimension D3 and the second lateral dimension D2 is greater than the fourth lateral dimension D4.

As shown in FIG. 1, the semiconductor die 110 may have a rectangular or rectangular-like shape in the bottom view and include four corners 110A. In some embodiments, the corner 110A may be a rounded corner or a sharp corner. In FIG. 1, the semiconductor die 110 has four corner regions RC1 at the four corners 110A and a center region RM1. The first conductive pads 120 are positioned at the corner regions RC1. The second conductive pads 130 are positioned at the center region RM1. Similarly, the first connector structures 140 are positioned at the corner regions RC1 and the second connector structures 150 are positioned at the center region RM1. The second conductive pads 120 are further away from a closest corner 100A of the semiconductor die 100 than the first conductive pads 110. For example, a distance F1 by which one first conductive pad 110 is spaced from a closest corner 110A is smaller than a distance F2 by which one second conductive pad 120 is spaced from a closest corner 110A.

In the embodiment, the corner regions RC1 may be triangular regions. A distribution range LC that is measured from a boundary BRC1 of the corner region RC1 to the corner 110A of the semiconductor die 110 may be not greater than 0.04 times of a length LS of the side edge SE of the semiconductor die 110. Accordingly, a distance F3 between the first conductive pad 120 and a closest corner 110A of the semiconductor die 110 may be smaller than or equal to 0.04 times of the length LS of the side edge SE of the semiconductor die 110. The second conductive pads 130 are spaced from the corners 110A of the semiconductor die 110 by a distance (such as F2) greater than 0.04 times of the length LS of the side edge SE of the semiconductor die 110. In some embodiments, the second conductive pads 130 have the same size and the boundary between the corner region RC1 and the center region RM1 may be defined between two adjacent conductive pads having different sizes.

Figure 4:
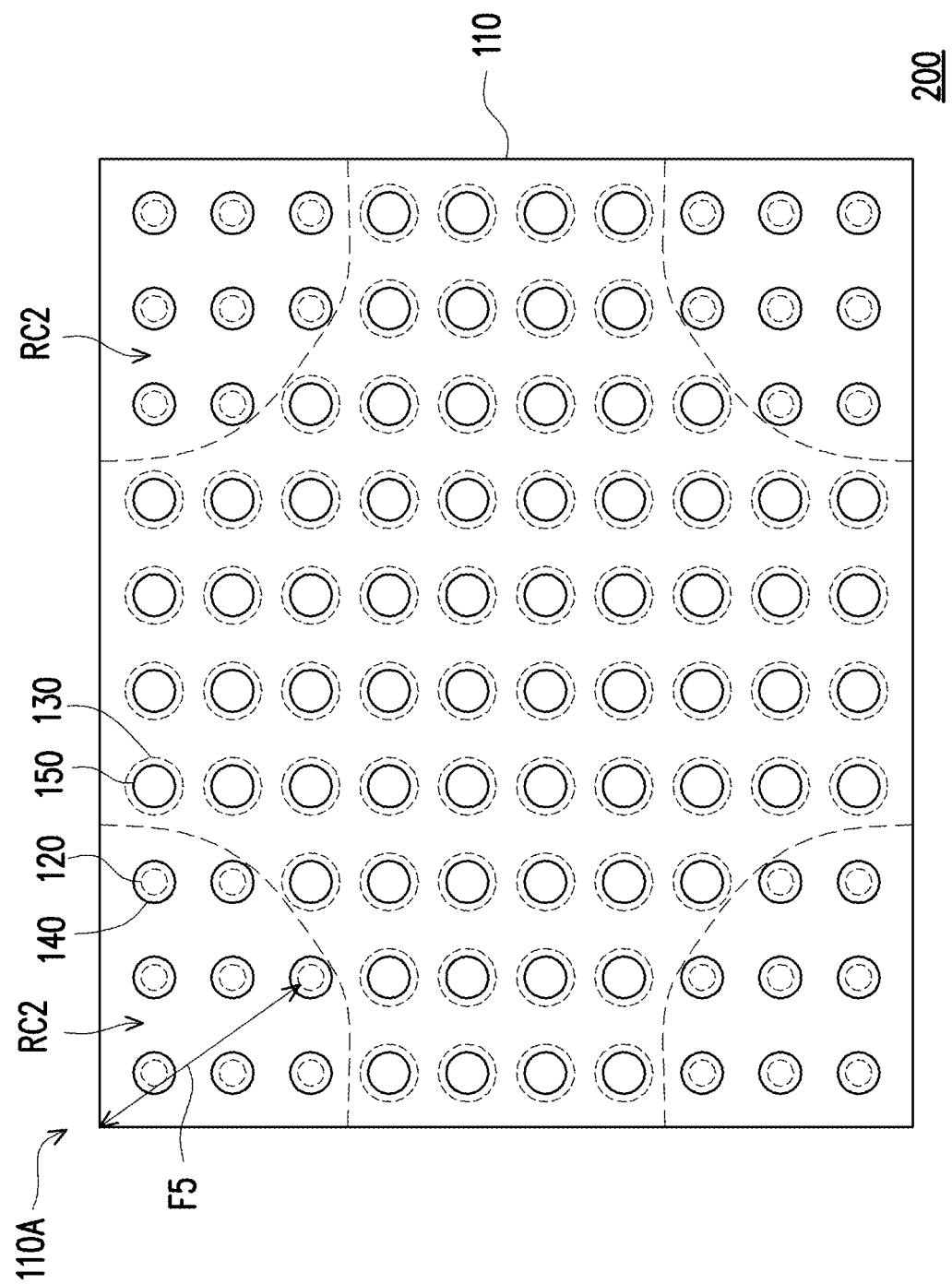
FIG. 4 schematically illustrates a plane view of a semiconductor device in accordance with some embodiments of the disclosure.

FIG. 4 schematically illustrates a plane view of a semiconductor device in accordance with some embodiments of the disclosure. A semiconductor device 200 includes a semiconductor die 110, first conductive pads 120, second conductive pads 130, first connector structures 140 and second connector structures 150. The semiconductor device 200 is similar to the semiconductor device 100 shown in FIG. 1 and similar or the same reference numbers in the two embodiments direct to similar or the same components. Specifically, in the semiconductor device 200, the semiconductor die 110 may have corner regions RC2 that are not triangular shaped. The corner region RC2 of the semiconductor die 110 may have a sector shape and the boundary between the corner region RC2 and the center region RM is curved boundary. In the corner region RC2, the farthest first conductive pad 120 away from the corner 110A may be spaced from the corner 110A by a distance F5 which may be not greater than 0.04 times of a length of the side edge of the semiconductor die 110.

Figure 5:
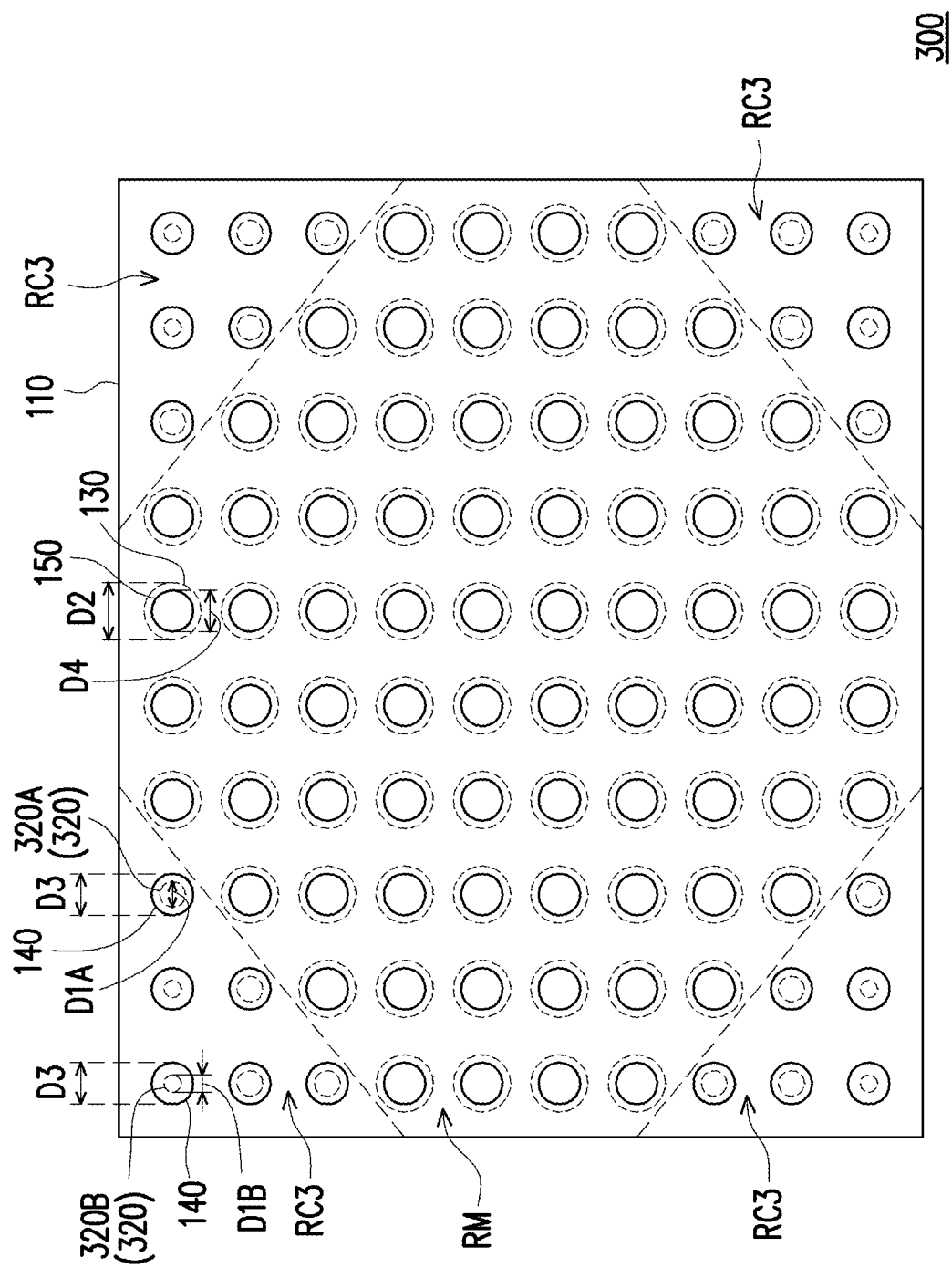
FIG. 5 schematically illustrates a semiconductor device in accordance with some embodiments of the disclosure.

FIG. 5 schematically illustrates a semiconductor device in accordance with some embodiments of the disclosure, and FIG. 5 presents the plane view of the semiconductor device showing the side of the semiconductor device that is to be bonded to other device through semiconductor die bonding process. A semiconductor device 300 may include a semiconductor die 110, first conductive pads 320, second conductive pads 130, first connector structures 140 and second connector structures 150. Some components of the semiconductor device 300 may be omitted in FIG. 3 for illustration purpose. In some embodiments, the semiconductor device 300 may further include wirings, dielectrics, active components, passive components, or a combination thereof. The first conductive pads 320 and the second conductive pads 130 are not exposed at the plane view of the semiconductor device 300 and are covered by at least one passivation layer (not shown). The first conductive pads 320 and the second conductive pads 130 are sketched by using dash lines for illustration purpose such that the relationship of the conductive pads and the connector structures is shown.

The first conductive pads 320 may include first conductive pads 320A and first conductive pads 320B having different sizes. The sizes of the second conductive pads 130 may be identical, the sizes of the first connector structure 140 may be identical, and the sizes of the second connector structures 150 may be identical. For example, the first conductive pad 320A has a first lateral dimension D1A that is different from a first lateral dimension DIB of the first conductive pad 320B. In addition, the second conductive pads 130 may have identical second lateral dimension D2, the first connector structure 140 may have identical third lateral dimension D3, and the second connector structure 150 may have identical fourth lateral dimension D4. The first lateral dimension D1A of one first conductive pad 320A is smaller than the third lateral dimension D3 of a corresponding first connector structure 140 and the first dimension DIB of one first conductive pad 320B is smaller than the third lateral dimension D3 of a corresponding first connector structure 140. The second lateral dimension D2 of each second conductive pad 130 is greater than the fourth lateral dimension D4 of a corresponding second connector structure 150.

Figure 6:
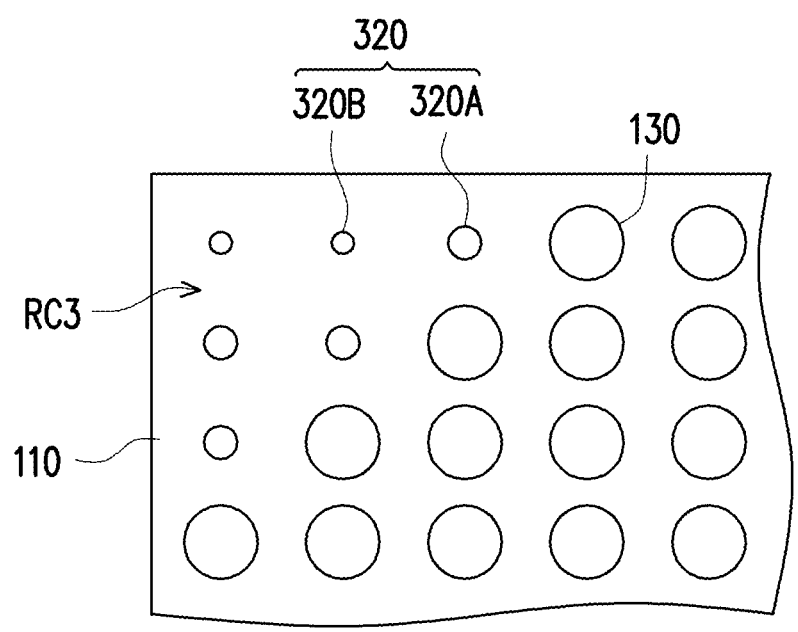
FIG. 6 schematically illustrates the arrangements of conductive pads in a plane view of the semiconductor device.

FIG. 6 schematically illustrates the arrangements of conductive pads in a plane view of the semiconductor device. Referring to FIGS. 5 and 6, in the embodiment, the first conductive pads 320 positioned at the corner region RC3 respectively has a size smaller than the second conductive pads 130 positioned within the center region RM1. The second conductive pads 130 have an identical size in the top view. In other words, the lateral dimensions of the second conductive pads 130 are the same. The first conductive pads 320 arranged at the corner region RC3 of the semiconductor die 110 may have two or more size designs, but the disclosure is not limited thereto. For example, the first conductive pad 320A may have a size greater than the first conductive pad 320B. In the embodiment, the sizes of the first conductive pad 320A and the first conductive pad 320 are smaller than the size of the corresponding second conductive pads 130. In some embodiments, the boundary between the corner region RC3 and the center region RM3 may be a straight linear boundary such that the corner region RC3 may have a triangular-like shape. In some other embodiments, the boundary between the corner region RC3 and the center region RM3 may be a curved boundary such that the corner region RC3 may have a sector-like shape.

Figure 7:
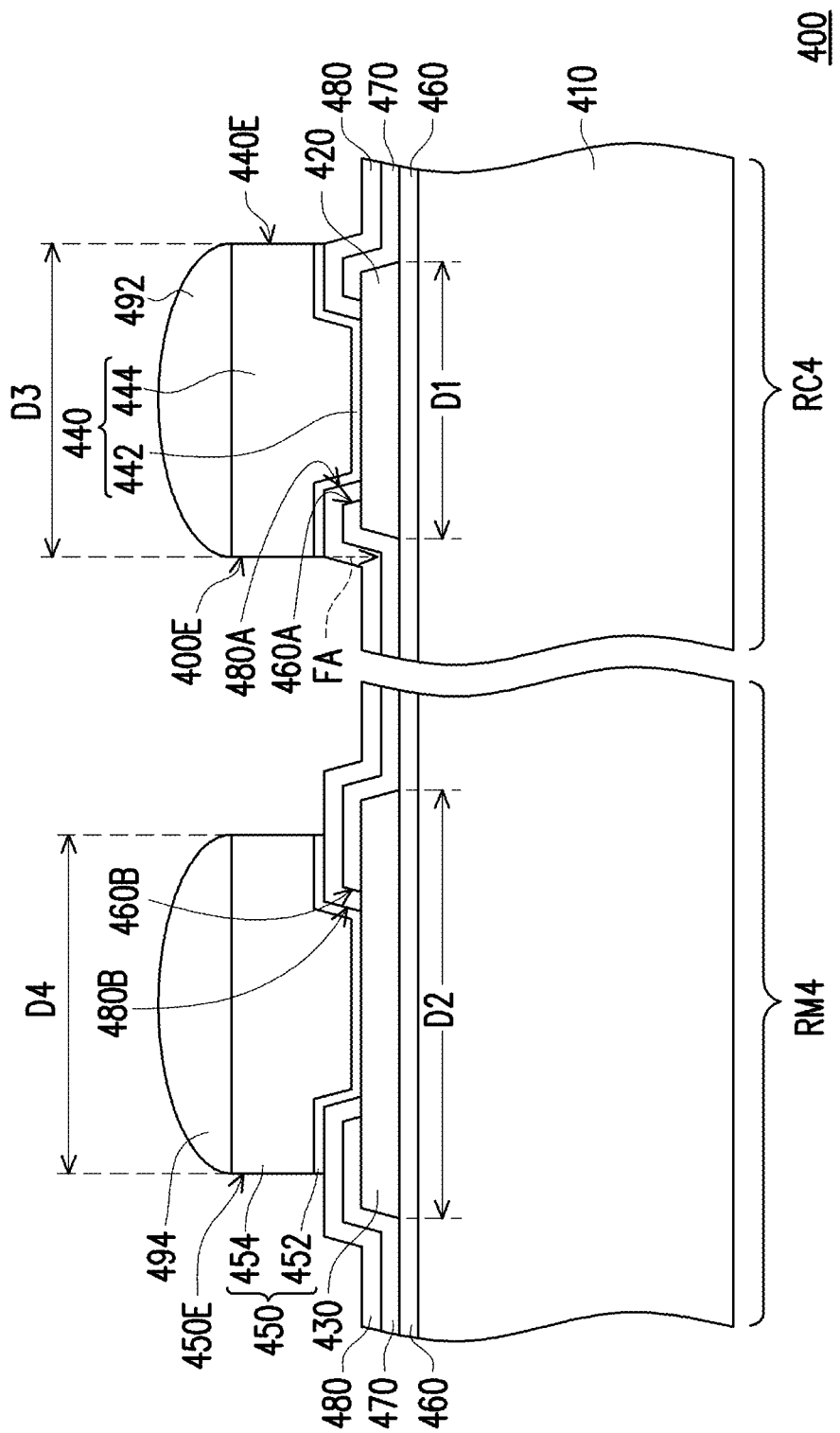
FIG. 7 schematically illustrates a cross section of a semiconductor device in accordance with some embodiments of the disclosure.

FIG. 7 schematically illustrates a cross section of a semiconductor device in accordance with some embodiments of the disclosure. A semiconductor device 400 includes a semiconductor die 410, a first conductive pad 420, a second conductive pad 430, a first connector structure 440 and a second connector structure 450. The first connector structure 440 and the second connector structure 450 are disposed on the semiconductor die 410 for bonding to another device through die bonding process. The first conductive pad 420 and the second conductive pad 430 are disposed on the semiconductor die 410. The first conductive pad 420 is between the first connector structure 440 and the semiconductor die 410 to form an electric connection between the first connector structure 440 and the semiconductor die 410. The second conductive pad 430 is between the second connector structure 450 and the semiconductor die 410 to form an electric connection between the second connector structure 450 and the semiconductor die 410. In addition, the semiconductor device 400 further includes a first passivation layer 460, a second passivation layer 470 and a protection layer 480 that are disposed between the metal layers/structures forming the first conductive pad 420, the second conductive pad 430, the first connector structure 440 and the second connector structure 450.

In some embodiments, the arrangement of the first conductive pad 420, the second conductive pad 430, the first connector structure 440 and the second connector structure 450 may refer to the arrangement of the conductive pads and the connector structures shown in any of FIGS. 1 to 5. Namely, the arrangement of the conductive pads and the connector structures shown in any of FIGS. 1 to 5 may be incorporated to the embodiment of FIG. 7 and alternately, the structure shown in FIG. 7 may be considered as an exemplary cross section structure of the semiconductor device presented in any of FIGS. 1 to 5. The semiconductor device 400 may have a center region RM4 and a corner region RC4 that is more proximate to the corner of the semiconductor device 400 than the center region RM4 as illustrated in any of FIGS. 1 to 5. The first conductive pad 420 as well as the first connector structure 440 is positioned within the corner region RC4, and the second conductive pad 430 and the second connector structure 450 are positioned within the center region RM4. In some embodiments, the distance between the first conductive pad 420 and a most adjacent corner of the semiconductor device 440 is smaller than the distance between the second conductor pad 430 and a most adjacent corner of the semiconductor device 450.

As shown in FIG. 7, the semiconductor die 410 may include electrical circuitry formed therein. Specifically, the semiconductor die 410 further includes electrical components, contact structures and wirings for electrically connecting the electrical components to form required electrical circuitry. For example, the electrical components may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. The above examples are provided for illustrative purposes only to further explain applications of some illustrative embodiments and are not meant to limit the disclosure. The contact and the wirings for electrically connecting the electrical components may include one or more inter-metal dielectric (IMD) layers and the associated metallization layers are formed over and interconnect the electric components.

The IMD layers may be formed of a low-K dielectric material, such as fluorinated silicate glass (FSG) formed by plasma-enhanced chemical vapor deposition (PECVD) techniques or high-density plasma CVD (HDPCVD), or the like, and may include intermediate etch stop layers. The metallization layers may be formed of copper or copper alloys, although they can also be formed of other metals. Further, the metallization layers include a top metal layer formed and patterned in or on the uppermost IMD layer to provide external electrical connections and to protect the underlying layers from various environmental contaminants. The uppermost IMD layer may be formed of a dielectric material, such as silicon nitride, silicon oxide, undoped silicon glass, and the like.

The first passivation layer 460 is disposed on the semiconductor die 410, the first conductive pad 420 and the second conductive pad 430 are disposed on the first passivation layer 460, the second passivation layer 470 is disposed on the first conductive pad 420 and the second conductive pad 430, the protection layer 480 is disposed on the second passivation layer 470, and the first connector structure 440 and the second connector structure 450 are disposed on the protection layer 480. In the embodiment, the first passivation layer 460, the second passivation layer 470 and the protection layer 480 may have one or more openings allowing the metal layers of the conductive pads and the connector structures to electrically connect to the overlying metal layer and/or the underlying metal layer. Therefore, the electric connection among the first conductive pad 420, the second conductive pad 430, the first connector structure 440 and the second connector structure 450 are formed.

The first passivation layer 460 is formed to separate the first conductive pad 420 and the second conductive pad 430 from the semiconductor die 410. The first passivation layer 460 may be formed of a dielectric material, such as undoped silicate glass (USG), silicon nitride, silicon oxide, silicon oxynitride or a non-porous material by any suitable method, such as CVD, PVD, or the like. The first passivation layer 460 may be a single layer or a laminated layer. A single layer of conductive pad and a passivation layer are shown in FIG. 7 for illustrative purposes only. As such, other embodiments may include any number of conductive layers and/or passivation layers. The first passivation layer 460 may have one or more openings (not shown) so that the metal layers of first conductive pad 420 and the second conductive pad 430 extend in the openings to contact the uppermost one of the metallization layers in the semiconductor die 410.

The first conductive pad 420 and the second conductive pad 430 disposed on the semiconductor die 410 may be formed of aluminum, aluminum copper, aluminum alloys, copper, copper alloys, or the like. The first conductive pad 420 has a first lateral dimension D1 and the second conductive pad 430 has a second lateral dimension D2. The lateral dimension depicted in FIG. 7 is the dimension that is measured in a direction substantially parallel to the plane of the semiconductor die 410 and extends along the cutting direction of the cross section. The first lateral dimension D1 is different from the second lateral dimension D2. In some embodiments, the first lateral dimension D1 is smaller than the second lateral dimension D2. In some embodiments, each of the first conductive pad 420 and the second conductive pad 430 may have a circular shape in the top view as depicted in FIGS. 1 to 6. In some alternative embodiments, each of the first conductive pad 420 and the second conductive pad 430 may have a non-circular shape in the top view, for example, a rectangular shape, a square shape, a pentagonal shape, a hexagonal, or other polygonal shape, or an oval shape, or other shapes.

The second passivation layer 470 is disposed on the first passivation layer 460, the first conductive pad 420 and the second conductive pad 430. The second passivation layer 470 may be formed of a dielectric material, such as undoped silicate glass (USG), silicon nitride, silicon oxide, silicon oxynitride or a non-porous material by any suitable method, such as CVD, PVD, or the like. The second passivation layer 470 may be a single layer or a laminated layer. The second passivation layer 470 is patterned by the use of masking methods, lithography technologies, etching processes, or combinations thereof, such that a first opening 460A is formed to expose a portion of first conductive pad 420 and a second opening 460B is formed to expose a portion of the second conductive pad 430. The second passivation layer 470 is between a portion of the first conductive pad 420 and a portion of the first connector structure 440, and between a portion of the second conductive pad 430 and a portion of the second connector structure 450. The second passivation layer 470 may cover the sidewall of the first conductive pad 420 and the sidewall of the second conductive pad 430, and expose the central portion of the first conductive pad 420 and the central portion of the second conductive pad 430.

The protective layer 480 is disposed on the second passivation layer 470, and has a third opening 480A exposing a portion of first conductive pad 420 and a fourth opening 480B exposing a portion of the second conductive pad 430. The protective layer 480 may not only cover the surface of the second passivation layer 470 facing away from the semiconductor die 410, but also cover the edge surface of the second passivation layer 470 at the first opening 470A and the second opening 470B. The protective layer 480 does not cover the central portion of the first conductive pad 420 at the third opening 480A and the central portion of the second conductive pad 430 at the fourth opening 480B. The protective layer 480 may be, for example, a polymer layer. The polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods.

The first connector structure 440 is disposed on the protection layer 480 and in physical contact with the first conductive pad 420 at the third opening 480A. The first connector structure 440 includes a first under-bump-metallurgy (UBM) layer 442 and a first pillar bump 444 disposed on the first UBM layer 442. The first UBM layer 442 is disposed at least on the exposed portion of the first conductive pad 420 at the third opening 480A, and extends over the protection layer 480 around the third opening 480A. The second connector structure 450 is disposed on the protection layer 480 and in physical contact with the second conductive pad 430 at the fourth opening 480B. The second connector structure 450 includes a second under-bump-metallurgy (UBM) layer 452 and a second pillar bump 454 disposed on the second UBM layer 452. The second UBM layer 452 is disposed on the exposed portion of the second conductive pad 430 at the third opening 480B, and extends over the protection layer 480 around the third opening 480B.

In some embodiments, each of the first UBM layer 442 and the second UBM layer 452 includes a first layer serving as a diffusion barrier layer or a glue layer, which is formed of titanium, tantalum, titanium nitride, tantalum nitride, or the like by physical vapor deposition (PVD) or sputtering. The first layer is deposited to a thickness of between about 500 and 2000 angstrom. In some embodiments, each of the first UBM layer 442 and the second UBM layer 452 includes a second layer serving as a seed layer, which is formed of copper or copper alloys by physical vapor deposition (PVD) or sputtering. The second layer is deposited to a thickness of between about 500 and 10000 Angstrom.

The first pillar bump 444 is disposed on the first UBM layer 442 and the second pillar bump 454 is disposed on the second UBM layer 452. Each of the first pillar bump 444 and the second pillar bump 454 may be a layer containing substantially pure elemental copper, copper containing unavoidable impurities, or copper alloys containing minor amounts of elements such as tantalum, indium, tin, zinc, manganese, chromium, titanium, germanium, strontium, platinum, magnesium, aluminum, or zirconium. The formation methods of the first pillar bump 444 and the second pillar bump 454 may include sputtering, printing, electro plating, electroless plating, or chemical vapor deposition (CVD) methods. For example, electro-chemical plating (ECP) is carried out to form the first pillar bump 444 and the second pillar bump 454. In an exemplary embodiment, the thickness of each of the first pillar bump 444 and the second pillar bump 454 is greater than 30 μm. In another exemplary embodiment, the thickness of each of the first pillar bump 444 and the second pillar bump 454 is greater than 40 μm. For example, each of the first pillar bump 444 and the second pillar bump 454 is of about 40 μm to 50 μm in thickness, or about 40 μm to 70 μm in thickness, although the thickness may be greater or smaller.

In the embodiment, a first solder cap 492 is disposed on top of the first connector structure 440 and a second solder cap 494 is disposed on top of the second connector structure 450. Each of the first solder cap 492 and the second solder cap 494 may be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc., formed by plating processes. In some embodiments, each of the first solder cap 492 and the second solder cap 494 is a lead-free solder cap. For example, the lead-free solder cap is SnAg with Ag content being controlled lower than 3.0 weight percent (wt %). In some embodiments, the lead-free solder cap is SnAg with Ag content being controlled at about 2.5 weight percent (wt %). A thermally reflowing process may be performed so that the first solder cap 492 and the second solder cap 494 are hemisphere-shaped, for example, either through the wafer heating or a rapid thermal processing (RTP). In some embodiments, the first solder cap 492 may have the same lateral dimension as the first connector structure 440 and the second solder cap 494 may have the lateral dimension as the second connector structure 450. In alternative embodiments, the first solder cap 492 and the second solder cap 494 may have different lateral dimensions from the first connector structure 440 and the second connector structure 450, respectively.

The first UBM layer 442 of the first connector structure 440 has a third lateral dimension D3 that is measured in a direction the same as the direction of measuring the first lateral dimension D1 of the first conductive pad 420. The first pillar bump 444 has a lateral dimension that is substantially identical to the first UBM layer 442. Therefore, in the plane view of the semiconductor device 400, the third dimension D3 may represent the lateral dimension of the first connector structure 440. In some embodiments, the lateral dimension of the first pillar bump 444 may be different from, for example smaller than the third dimension D3 of the first UBM layer 442. The third dimension D3 is greater than the first dimension D1. In some embodiments, the first conductive pad 420 may be completely under the first connector structure 440. Therefore, a virtual line of the edge 440E of the first connector structure 440 extending towards the semiconductor die 410 may not pass through the first conductive pad 420.

The second UBM layer 452 of the second connector structure 450 has a fourth lateral dimension D4 that is measured in a direction the same as the direction of measuring the second lateral dimension D2 of the second conductive pad 430. The second pillar bump 454 has a lateral dimension that is substantially identical to the second UBM layer 452. Therefore, in the plane view of the semiconductor device 400, the fourth dimension D4 may represent the lateral dimension of the second connector structure 450. In some embodiments, the lateral dimension of the second pillar bump 454 may be different from, for example smaller than the fourth dimension D4 of the second UBM layer 452. The fourth dimension D4 is not greater than, for example equal to or smaller than, the second lateral dimension D2 of the second conductive pad 430. In some embodiments, the second conductive pad 430 may exceed the second connector structure 440 in the lateral direction. Therefore, a virtual line of the edge 450E of the second connector structure 450 extending towards the semiconductor die 410 passes through the second conductive pad 430.

In some embodiments, the third lateral dimension D3 of the first connector structure 440 is the same as the fourth lateral dimension D4 of the second connector structure 450. The first lateral dimension D1 of the first conductive pad 420 is smaller than the second lateral dimension D2 of the second conductive pad 430. The first connecter structure 440, the second connector structure 450 and the second conductive pad 430 each has a lateral dimension greater than the first conductive pad 420. In some alternative embodiments, the first connecter structure 440, the second connector structure 450 and the second conductive pad 430 may have the same lateral dimension, and namely, the second lateral dimension D2 may be the same as the third lateral dimension D3 and the fourth lateral dimension D4.

In some embodiments, for determining the reliability of the semiconductor device 400, a thermal cycling test is performed to heat and cool the semiconductor device 400 for cycles. During the thermal cycling test, certain stress is generated due to the difference on the physical property of various materials. For example, the materials of various layers/elements have different thermal expansion coefficients so that the different expansions during the thermal cycling test cause stress in the semiconductor device 400. In some embodiments, the stress generated during the thermal cycling test may be more concentrated in the corner region RC4 than in the center region RM4. In some embodiments, the stress FA may be generated along the edge 440E of the first connector structure 440 and apply to the second passivation layer 470. In the corner region RC4, the first conductive pad 420 is smaller than the first connector structure 440 so that under the edge 440E of the first connector structure 440, the second passivation layer 470 is laid on the first passivation layer 460. The first passivation layer 460 underlying the second passivation layer 470 serves as a buffer for reducing the stress FA applied to the second passivation layer 470. Accordingly, the second passivation layer 470 does not crack or the cracking of the second passivation layer 470 is mitigated without causing failure and/or unsatisfactory of the semiconductor device 400 during the thermal cycling test. In other words, the semiconductor device 400 has an improved reliability.

Figure 8:
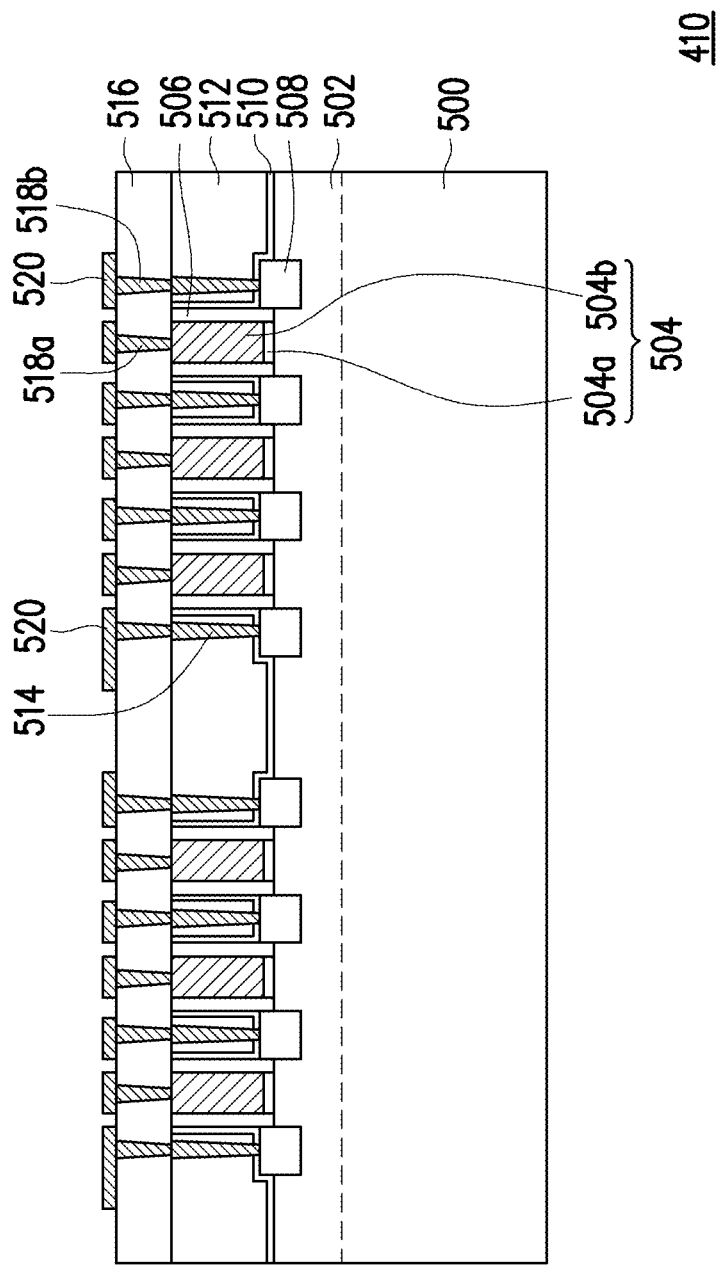
FIG. 8 schematically illustrates an exemplary embodiment of the semiconductor die 410 depicted in FIG. 7.

FIG. 8 schematically illustrates an exemplary embodiment of the semiconductor die 410 depicted in FIG. 7. The semiconductor die 410 includes a semiconductor substrate 500, a fin structure 502, metal gate stacks 504, spacer elements 506, epitaxial structures 508, an etch stop layer 510, a dielectric layer 512, contacts 514, a dielectric layer 516, contacts 518a, contacts 518b, and conductive wirings 520. The metal gate stacks 504 partially cover and wrap around the fin structure 502, respectively. The metal gate stacks 504 may be substantially identical in width. In some alternative embodiments, the metal gate stacks 504 may be different in width. The metal gate stacks 504 each include a gate dielectric layer 504a and a gate electrode 504b.

In some embodiments, the semiconductor substrate 500 is a bulk semiconductor substrate, such as a semiconductor wafer. For example, the semiconductor substrate 500 includes silicon or other elementary semiconductor materials such as germanium. The semiconductor substrate 500 may be an un-doped or doped (e.g., p-type, n-type, or a combination thereof) semiconductor substrate. In some embodiments, the semiconductor substrate 500 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 500 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}SbY4$, where X1, X2, X3, Y1, Y2, Y3, and Y4 represent relative proportions. Each one of X1, X2, X3, Y1, Y2, Y3, and Y4 is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 500 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 500 includes a multi-layered structure. For example, the semiconductor substrate 500 includes a silicon-germanium layer formed on a bulk silicon layer.

In some embodiments, multiple recesses (or trenches) are formed in the semiconductor substrate 500. As a result, the fin structure 502 that protrudes from the surface of the semiconductor substrate 500 is formed or defined between the recesses (or trenches). In some embodiments, one or more photolithography and etching processes are used to form the recesses (or trenches). In some embodiments, the fin structure 502 is in direct contact with the semiconductor substrate 500. However, embodiments of the disclosure have many variations and/or modifications. In some other embodiments, the fin structure 502 is not in direct contact with the semiconductor substrate 500. One or more other material layers (not shown in FIG. 5) may be formed between the semiconductor substrate 500 and the fin structures 502. For example, a dielectric layer is formed between the semiconductor substrate 500 and the fin structure 502. In some embodiments, multiple fin structures may be formed on the semiconductor substrate 500 and the number of the fin structure is not limited.

In some embodiments, isolation features (not shown in FIG. 8) are formed in the recesses to surround a lower portion of the fin structure 502, in accordance with some embodiments. The isolation features are used to define and electrically isolate various device elements formed in and/or over the semiconductor substrate 500. In some embodiments, the isolation features include shallow trench isolation (STI) features, local oxidation of silicon (LOCOS) features, another suitable isolation feature, or a combination thereof. In some embodiments, each of the isolation features has a multi-layer structure. In some embodiments, the isolation features are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 500 and the isolation features. Similarly, the STI liner may also be used to reduce crystalline defects at the interface between the fin structures and the isolation features.

The metal gate stacks 504 each including a gate dielectric layer 504a and a gate electrode 504b may be disposed on the fin structure 502 and formed by a gate replacement process. In some embodiments, the gate dielectric layer 504a is made of or includes a dielectric material with high dielectric constant (high-K). The gate dielectric layer 504a may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 504a may be deposited using an ALD process, a CVD process, one or more other applicable processes, or a combination thereof. In some embodiments, the formation of the gate dielectric layer 504a involves a thermal operation.

The gate electrode 504b may include a work function layer and a conductive filling layer, in accordance with some embodiments. The work function layer may be used to provide the desired work function for transistors to enhance device performance including improved threshold voltage. In some embodiments, the work function layer is used for forming an NMOS device. The work function layer is an n-type work function layer. The n-type work function layer is capable of providing a work function value suitable for the device, such as equal to or less than about 4.5 eV. The n-type work function layer may include metal, metal carbide, metal nitride, or a combination thereof. For example, the n-type work function layer includes titanium nitride, tantalum, tantalum nitride, one or more other suitable materials, or a combination thereof. In some other embodiments, the n-type work function layer is an aluminum-containing layer. The aluminum-containing layer may be made of or include TiAlC, TiAlO, TiAlN, one or more other suitable materials, or a combination thereof.

In some embodiments, the work function layer is used for forming a PMOS device. The work function layer is a p-type work function layer. The p-type work function layer is capable of providing a work function value that is suitable for the device, such as equal to or greater than about 4.8 eV. The p-type work function layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 522 may be fine-tuned to adjust the work function level. For example, a titanium nitride layer is used as a p-type work function layer or an n-type work function layer, depending on the thickness and/or the compositions of the titanium nitride layer. The work function layer may be deposited over the gate dielectric layer 504a using an ALD process, a CVD process, a PVD process, an electroplating process, an electroless plating process, one or more other applicable processes, or a combination thereof.

In some embodiments, a barrier layer is formed before the formation of the work function layer to interface the gate dielectric layer 504a with the subsequently formed work function layer. The barrier layer may also be used to prevent diffusion between the gate dielectric layer 504a and the barrier of the gate electrode 504b. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

The spacer elements 506 are disposed over sidewalls of the metal gate stacks 504. In some embodiments, the spacer elements 506 are made of or include a dielectric material. The dielectric material may include silicon nitride, silicon oxynitride, silicon oxide, silicon carbide, one or more other suitable materials, or a combination thereof.

The epitaxial structures 508 respectively disposed over the fin structure 502 may function as source/drain features. In some embodiments, the portions of the fin structure 502 that are not covered by the metal gate stacks 504 and the spacer elements 506 are recessed before the formation of the epitaxial structures 508. In some embodiments, the recesses laterally extend towards the channel regions under the metal gate stacks 504. For example, portions of the recesses are directly below the spacer elements 506. Afterwards, one or more semiconductor materials are epitaxially grown on sidewalls and bottoms of the recesses to form the epitaxial structures 508. In some embodiments, both the epitaxial structures 508 at two opposite sides of one metal gate stacks 504 are p-type semiconductor structures. In some other embodiments, both the epitaxial structures 508 at two opposite sides of one metal gate stacks 504 are n-type semiconductor structures. In some other embodiments, one of the epitaxial structures 508 is a p-type semiconductor structure, and another one is an n-type semiconductor structure. A p-type semiconductor structure may include epitaxially grown silicon germanium or silicon germanium doped with boron. An n-type semiconductor structure may include epitaxially grown silicon, epitaxially grown silicon carbide (SiC), epitaxially grown silicon phosphide (SiP), or another suitable epitaxially grown semiconductor material. In some embodiments, the epitaxial structures 508 are formed by an epitaxial process. In some other embodiments, the epitaxial structures 508 are formed by separate processes, such as separate epitaxial growth processes. The epitaxial structures 508 may be formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, one or both of the epitaxial structures 508 are doped with one or more suitable dopants. For example, the epitaxial structures 508 are SiGe source/drain features doped with boron (B), indium (In), or another suitable dopant. Alternatively, in some other embodiments, one or both of the epitaxial structures 508 are Si source/drain features doped with phosphor (P), antimony (Sb), or another suitable dopant. In some embodiments, the epitaxial structures 508 are doped in-situ during their epitaxial growth. In some other embodiments, the epitaxial structures 508 are not doped during the growth of the epitaxial structures 508. Instead, after the formation of the epitaxial structures 508, the epitaxial structures 508 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, one or more annealing processes are performed to activate the dopants in the epitaxial structures 508. For example, a rapid thermal annealing process is used.

The etch stop layer 510 and the dielectric layer 512 are sequentially disposed over the semiconductor substrate 500 and the epitaxial structures 508, in accordance with some embodiments. The etch stop layer 510 may conformally extend along the surfaces of the spacer elements 506 and the epitaxial structures 508. The dielectric layer 512 covers the stop layer 510 and surrounds the spacer elements 510 and the metal gate stacks 504. The etch stop layer 510 may be made of or include silicon nitride, silicon oxynitride, silicon carbide, one or more other suitable materials, or a combination thereof. In some embodiments, the etch stop layer 510 is deposited over the semiconductor substrate 500 using a CVD process, an ALD process, a PVD process, one or more other applicable processes, or a combination thereof. The dielectric layer 512 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. In some embodiments, the dielectric layer 512 is deposited using a CVD process, an ALD process, a FCVD process, a PVD process, one or more other applicable processes, or a combination thereof. The top surfaces of the dielectric layer 512, the etch stop layer 510, the spacer elements 506, and the metal gate stacks 504 are substantially level with each other.

The semiconductor substrate 500, the fin structure 502, the metal gate stacks 504, the spacer elements 506, the epitaxial structures 508, the etch stop layer 510, and the dielectric layer 512 are formed by manufacturing processes of front end of line (FEOL). After the manufacturing processes of front end of line, the dielectric layer 516, the contacts 518a, the contacts 518b, and the conductive wirings 520 are formed over the semiconductor substrate 500.

The contacts 514 penetrate through the dielectric layer 512 and the etch stop layer 510, and the contacts 514 may serve as bottom portions of source/drain contacts which are electrically connected to the epitaxial structures 508 (i.e. the source/drain features).

The dielectric layer 516 may be disposed over the dielectric layer 512. In some embodiments, the dielectric layer 516 is deposited over the dielectric layer 512 using a CVD process, an ALD process, a FCVD process, a PVD process, one or more other applicable processes, or a combination thereof. The dielectric layer 516 may be made of or include silicon oxide, silicon oxynitride, BSG, PSG, BPSG, FSG, low-k material, porous dielectric material, one or more other suitable materials, or a combination thereof. The dielectric layer 516 may be patterned by any suitable method. For example, the dielectric layer 516 is patterned using photolithography process. After patterning the dielectric layer 516, through holes are formed in the dielectric layer 516 such that portions of the contacts 514 and portions of the gate electrodes 504b are exposed. A conductive material (e.g., copper or other suitable metallic materials) may be deposited over the dielectric layer 516 and fill into the through holes defined in the dielectric layer 516. The conductive material may be deposited using a CVD process or other applicable processes. In some embodiments, a planarization process is performed to remove the deposited conductive material until the top surface of the dielectric layer 516 is revealed. The planarization process may include a chemical mechanical polishing (CMP) process, a grinding process, an etching process, a dry polishing process, one or more other applicable processes, or a combination thereof. As shown in FIG. 8, the contacts 518a and 518b are formed to penetrate through the dielectric layer 516, the contact 518a may serve as gate contacts which are electrically connected to the gate electrode 504b, and the contacts 518b land on the contacts 514 and may serve as upper portions of source/drain contacts.

The conductive wirings 520 may be disposed on the dielectric layer 516 to electrically connect to the contacts 518a and 518b. A conductive material (e.g., copper or other suitable metallic materials) may be deposited on the top surfaces of the dielectric layer 516, and the conductive material may be patterned by any suitable method to form the conductive wirings 520. For example, the conductive material is deposited using a CVD process or other applicable processes, and the conductive material is patterned using photolithography process. After forming the conductive wirings 520, manufacturing processes of middle end of line (MEOL) are accomplished, and manufacturing processes of back end of line (BEOL) are performed to fabricate the first conductive pad 420, the second conductive pad 430, the first connector structure 440 and the second connector structure 450 that are depicted in FIG. 7 on the semiconductor die 410.

Figure 9:
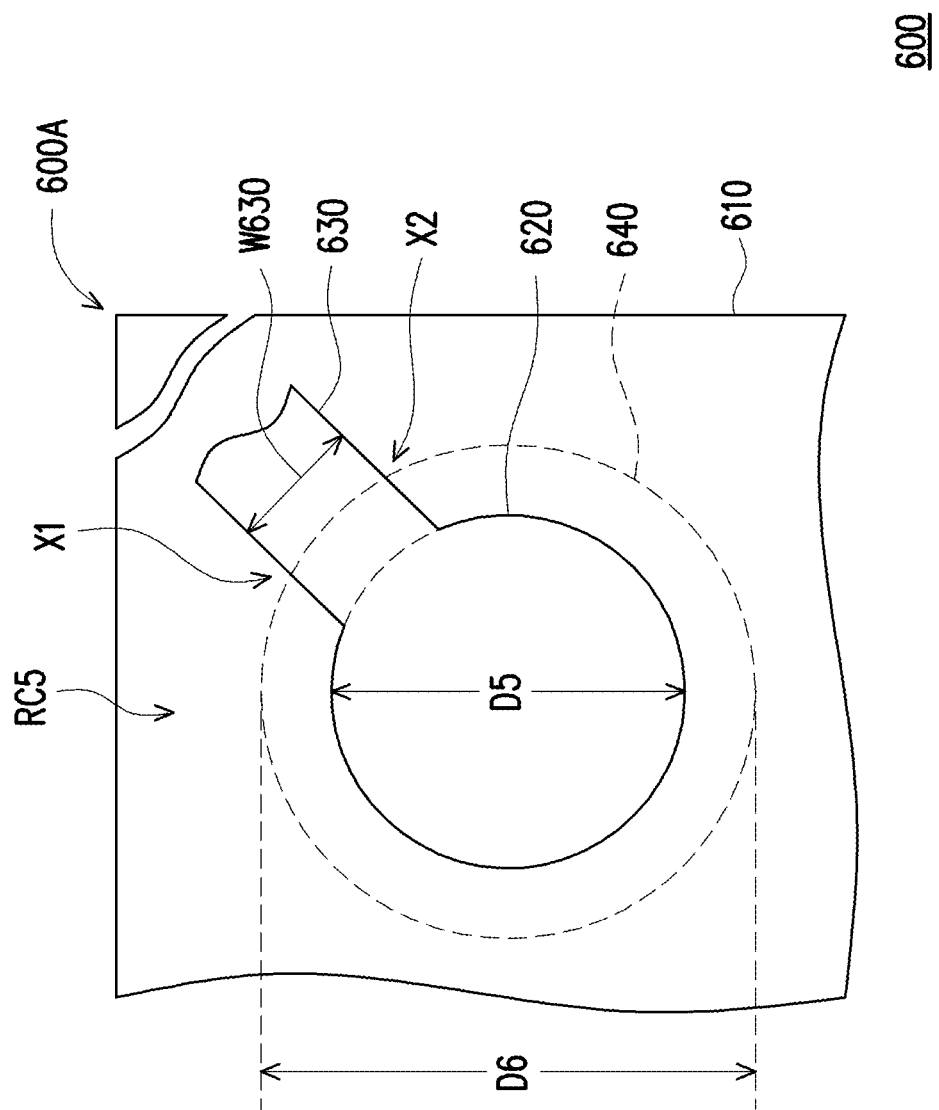
FIG. 9 schematically illustrates a partial plane view showing a portion of a layer of conductive pad in a semiconductor device in accordance with some embodiments of the disclosure.

FIG. 9 schematically illustrates a partial plane view showing a portion of a layer of conductive pad in a semiconductor device in accordance with some embodiments of the disclosure. A semiconductor device 600 includes a semiconductor die 610, a conductive pad 620 and a conductive wiring 630. The semiconductor device 600 has a corner region RC5 that is proximate to the corner 600A. The conductive pad 620 and the conductive wiring 630 are disposed within the corner region RC5 and are of the same layer. The conductive wiring 630 is connected to the conductive pad 620. In FIG. 9, a connector structure 640 is depicted using a dash line for illustration purpose. The semiconductor device 600 may further include other components that are described in the above embodiments. The range and the distribution of the corner region RC5 in FIG. 9 may refer to the corner regions RC1 to RC4 described in above embodiments.

The conductive pad 620 and the connector structure 640 may have similar design as the first conductive pads 120, 320 and 420 and the connector structures 140 and 440 and the above details of the first conductive pads 120, 320 and 420 and the connector structures 140 and 440 may be applicable for the conductive pad 620 and the connector structure 640. The conductive pad 620 has a lateral dimension D5 smaller than the connector structure 640. As shown in FIG. 9, the area of the conductive pad 620 may be completely within the area of the connector structure 640. The conductive wiring 630 is connected to the conductive pad 620 and extend to exceed the area of the connector structure 640. In some embodiments, the conductive wiring 630 may be of the same layer as the conductive pad 620. The trace of the conductive wiring 630 may pass through the outline of the area of the connector structure 640 in the plane view. In some embodiments, a line width W630 of the conductive wiring 630 is ranged from 5 μm to 15 μm. The outline of the conductive wiring 630 and the outline of the connector structure 640 in the plane view may be intersected at intersections X1 and X2. In some embodiments, the line width W630 may be substantially identical to the distance between the intersections X1 and X2. In some alternative embodiments, the conductive wiring 630 may not connect to the conductive pad 620 but partially overlap the connector structure 640 in the plane view.

Figure 10:
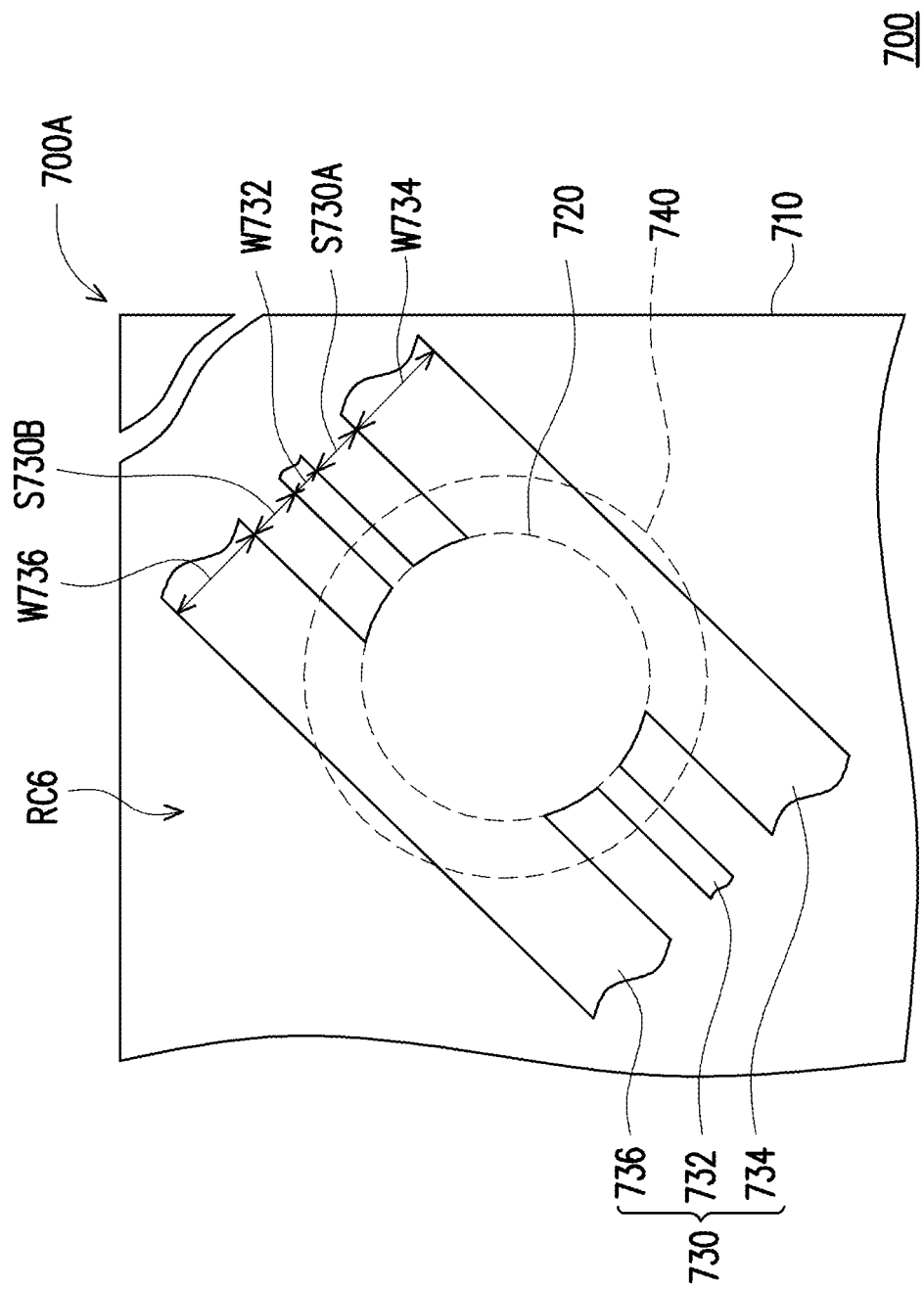
FIG. 10 schematically illustrates a partial plane view showing a portion of a layer of conductive pad in a semiconductor device in accordance with some embodiments of the disclosure.

FIG. 10 schematically illustrates a partial plane view showing a portion of a layer of conductive pad in a semiconductor device in accordance with some embodiments of the disclosure. A semiconductor device 700 includes a semiconductor die 710, a conductive pad 720 and conductive wirings 730. The semiconductor device 700 has a corner region RC6 that is proximate to the corner 700A. The conductive pad 720 and the conductive wirings 730 are disposed within the corner region RC6 and are of the same layer. The conductive wirings 730 may include the conductive wiring 732, the conductive wiring 734 and the conductive wiring 736. In some embodiments, the conductive wiring 732, the conductive wiring 734 and the conductive wiring 736 may be formed of the same layer as the conductive pad 720. In FIG. 10, a connector structure 740 is depicted using a dash line for illustration purpose. The semiconductor device 700 may further include other components that are described in the above embodiments. The range and the distribution of the corner region RC6 in FIG. 10 may refer to the corner regions RC1 to RC4 described in above embodiments.

The conductive pad 720 and the connector structure 740 may have similar design as the first conductive pads 120, 320 and 420 and the connector structures 140 and 440 and the above details of the first conductive pads 120, 320 and 420 and the connector structures 140 and 440 may be applicable for the conductive pad 720 and the connector structure 740. The conductive pad 720 has a lateral dimension smaller than the connector structure 740. As shown in FIG. 10, the area of the conductive pad 720 may be completely within the area of the connector structure 740.

The conductive wiring 732 the conductive wiring 734 and the conductive wiring each extends to pass through the outline of the area of the connector structure 740 in the plane view. In some embodiments, a line width W732 of the conductive wiring 732, a line width W734 of the conductive wiring 734 and a line width W734 of the conductive wiring 734 are respectively ranged from 5 μm to 15 μm. In addition, the spacing S730A between the conductive wiring 732 and the conductive wiring 734 and the spacing S730B between the conductive wiring 732 and the conductive wiring 736 may respectively be greater than 5 μm.

The semiconductor device in accordance with embodiments of the disclosure includes various designs of conductive pads contacting the connector structure at different regions. At the corner region or a region proximate to the corner of the semiconductor device, the conductive pad underlying the connector structure is smaller than the connector structure. At the center region or a region having identical sized conductive pads, the conductive pad underlying the connector structure is not smaller than the connector structure. At the corner region, the passivation layer is sandwiched between an underlying passivation layer and the connector structure having larger size than the conductive pad, which helps to reduce the stress suffered by the passivation layer and improve the reliability of the passivation.

An embodiment of the present invention relates to a semiconductor device including a semiconductor die, a first conductive pad, a second conductive pad, a first connector structure and a second connector structure. The first conductive pad is disposed on the semiconductor die, wherein the first conductive pad has a first lateral dimension. The second conductive pad is disposed on the semiconductor die, wherein the second conductive pad has a second lateral dimension. The first connector structure is disposed on the first conductive pad, wherein the first connector structure has a third lateral dimension greater than the first lateral dimension. The second connector structure is disposed on the second conductive pad, wherein the second connector structure has a fourth lateral dimension smaller than the second lateral dimension. The fourth lateral dimension is identical to the third lateral dimension. The semiconductor device further includes a passivation layer disposed on the semiconductor die and covering a sidewall of the first conductive pad and a sidewall of the second conductive pad. The passivation layer is between a portion of the first conductive pad and a portion of the first connector structure, and between a portion of the second conductive pad and a portion of the second connector structure. The semiconductor device further includes a protection layer disposed on the semiconductor die, wherein the protection layer has a first opening above the first conductive pad and a second opening above the second conductive pad, the first connector structure is connected to the first conductive pad through the first opening, and the second connector structure is connected to the second conductive pad through the second opening. The first connector structure includes a first under-bump-metallurgy (UBM) layer and a first pillar bump disposed on the first UBM layer and the second connector structure comprises a second UBM layer and a second pillar bump disposed on the second UBM layer. The second conductive pad is further away from a corner of the semiconductor die than the first conductive pad. A distance between the first conductive pad and a corner of the semiconductor die is smaller than or equal to 0.04 times of a length of a side edge of the semiconductor die.

Another embodiment of the present invention relates to a semiconductor device including a semiconductor die, a first conductive pad, a second conductive pad, a first connector structure, and a second connector structure. The first conductive pad is disposed on the semiconductor die at a first area. The second conductive pad is disposed on the semiconductor die at a second area further away from a corner of the semiconductor die than the first area, wherein the first conductive pad has a first lateral dimension, and the second conductive pad has a second lateral dimension greater than the first lateral dimension. The first connector structure is disposed on the first conductive pad. The second connector structure disposed on the second conductive pad. The first connector structure comprises a first UBM layer and a first pillar bump disposed on the first UBM layer, and the second connector structure comprises a second UBM layer and a second pillar bump disposed on the second UBM layer. The first connector structure and the second connector structure have an identical lateral dimension. A distance between the first conductive pad and a corner of the semiconductor die is smaller than or equal to 0.04 times of a length of a side edge of the semiconductor die. The first connector structure has a third lateral dimension, the second connector structure has a fourth lateral dimension identical to the third lateral dimension. The semiconductor device further includes a passivation layer disposed on the semiconductor die and covering a sidewall of the first conductive pad and a sidewall of the second conductive pad. The passivation layer is between a portion of the first conductive pad and a portion of the first connector structure, and between a portion of the second conductive pad and a portion of the second connector structure.

Still another embodiment of the present invention relates to a semiconductor device including a semiconductor die, a plurality of first conductive pads, a plurality of second conductive pads, a plurality of first connector structures, and a plurality of second connector structures. The first conductive pads are disposed on the semiconductor die at a first area, wherein two of the first conductive pads have different lateral dimensions. The second conductive pads are disposed on the semiconductor die at a second area further away from a corner of the semiconductor die than the first area. The first connector structures are disposed on the first conductive pads, wherein a lateral dimension of each of the first connector structures is greater than a corresponding first conductive pad. The second connector structures are disposed on the second conductive pads. The semiconductor device further includes a passivation layer disposed on the semiconductor die and covering a sidewall of the first conductive pad and a sidewall of the second conductive pad. The passivation layer is between a portion of the first conductive pad and a portion of the first connector structures, and between a portion of the second conductive pad and a portion of the second connector structures. A lateral dimension of each of the second connector structures is smaller than a corresponding second conductive pad. The semiconductor device further includes first solder caps disposed on the first connector structures and second solder caps disposed on the second connector structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor die;
a first conductive pad disposed on the semiconductor die, wherein the first conductive pad has a first top view profile;
a second conductive pad disposed on the semiconductor die, wherein the second conductive pad has a second top view profile, and is further away from a corner of the semiconductor die than the first conductive pad;
a first connector structure disposed on the first conductive pad, wherein the first connector structure has a third top view profile and the first top view profile is within the third top view profile;
a conductive wiring, wherein the conductive wiring is of the same layer as the first conductive pad and laterally extends to intersect with a portion of the third top view profile of the first connector structure; and
a second connector structure disposed on the second conductive pad, wherein the second connector structure has a fourth top view profile and the fourth top view profile is within the second top view profile.

2. The semiconductor device according to claim 1, wherein a fourth lateral dimension of the fourth top view profile is identical to a third lateral dimension of the third profile.

3. The semiconductor device according to claim 1, further comprising a passivation layer disposed on the semiconductor die and covering a sidewall of the first conductive pad and a sidewall of the second conductive pad.

4. The semiconductor device according to claim 3, wherein the passivation layer is between a portion of the first conductive pad and a portion of the first connector structure, and between a portion of the second conductive pad and a portion of the second connector structure.

5. The semiconductor device according to claim 1, further comprising a protection layer disposed on the semiconductor die and in contact with a portion of a top surface of the first conductive pad and a portion of a top surface of the second conductive pad, wherein the protection layer has a first opening above the first conductive pad and a second opening above the second conductive pad, the first connector structure is connected to the first conductive pad through the first opening, and the second connector structure is connected to the second conductive pad through the second opening.

6. The semiconductor device according to claim 1, wherein the first connector structure comprises a first under-bump-metallurgy (UBM) layer and a first pillar bump disposed on the first UBM layer and the second connector structure comprises a second UBM layer and a second pillar bump disposed on the second UBM layer.

7. The semiconductor device according to claim 1, wherein a distance between the first conductive pad and the corner of the semiconductor die is smaller than or equal to 0.04 times of a length of a side edge of the semiconductor die.

8. A semiconductor device comprising:
a semiconductor die;
a first conductive pad disposed on the semiconductor die at a first area;
a second conductive pad disposed on the semiconductor die at a second area further away from a corner of the semiconductor die than the first area, wherein the first conductive pad has a first plane view area, and the second conductive pad has a second plane view area greater than the first plane view area;
a first connector structure disposed on the first conductive pad;
a conductive wiring, wherein the conductive wiring is of the same layer as the first conductive pad and laterally extends to intersect with a portion of a plane view area of the first connector structure; and
a second connector structure disposed on the second conductive pad.

9. The semiconductor device according to claim 8, wherein the first connector structure comprises a first UBM layer and a first pillar bump disposed on the first UBM layer, and the second connector structure comprises a second UBM layer and a second pillar bump disposed on the second UBM layer, wherein the first UBM layer and the second UBM layer have an identical lateral dimension.

10. The semiconductor device according to claim 8, wherein a distance between the first conductive pad and the corner of the semiconductor die is smaller than or equal to 0.04 times of a length of a side edge of the semiconductor die.

11. The semiconductor device according to claim 8, wherein the first connector structure has a third plane view area, and the second connector structure has a fourth plane view area identical to the third plane view area.

12. The semiconductor device according to claim 8, further comprising a passivation layer disposed on the semiconductor die and covering a sidewall of the first conductive pad and a sidewall of the second conductive pad, wherein the passivation layer is between a portion of the first conductive pad and a portion of the first connector structure, and between a portion of the second conductive pad and a portion of the second connector structure.

13. Semiconductor device, comprising:
a semiconductor die;
a plurality of first conductive pads disposed on the semiconductor die at a first area, wherein two of the first conductive pads have different plane view areas;
a plurality of second conductive pads disposed on the semiconductor die at a second area further away from a corner of the semiconductor die than the first area;
a plurality of first connector structures disposed on the first conductive pads, wherein a plane view area of each of the first connector structures is greater than a corresponding first conductive pad;
a conductive wiring, wherein the conductive wiring is of the same layer as the first conductive pads and laterally extends to intersect with a portion of a plane view of one of the first connector structures; and
a plurality of second connector structures disposed on the second conductive pads.

14. The semiconductor device according to claim 13, further comprising a passivation layer disposed on the semiconductor die and covering sidewalls of the first conductive pads and sidewalls of the second conductive pads, wherein the passivation layer is between a portion of one first conductive pad and a portion of a corresponding first connector structure, and between a portion of one second conductive pad and a portion of a corresponding second connector structure.

15. The semiconductor device according to claim 13, wherein a plane view area of each of the second connector structures is smaller than a corresponding second conductive pad.

16. The semiconductor device according to claim 13, further comprising first solder caps disposed on the first connector structures and second solder caps disposed on the second connector structures.

17. The semiconductor device according to claim 13, wherein the plane view area of each of the first connector structures is greater than a plane view area of each of the second connector structures.

18. The semiconductor device according to claim 13, wherein a plane view area of each of the second connector structures is greater than each of the first conductive pads.

19. The semiconductor device according to claim 13, wherein a first portion of the first conductive pads and a second portion of the first conductive pads are arranged in a line and positioned at opposite sides of a portion of the second conductive pads.

20. The semiconductor device according to claim 13, wherein a pitch of the first connector structures is identical to a pitch of the second connector structures.

* * * * *